(12) United States Patent
Kohno et al.

(10) Patent No.: US 6,714,030 B2
(45) Date of Patent: Mar. 30, 2004

(54) SEMICONDUCTOR INSPECTION APPARATUS

(75) Inventors: Ryuji Kohno, Chiyoda (JP); Hideo Miura, Koshigaya (JP); Yoshishige Endo, Tsuchiura (JP); Masatoshi Kanamaru, Miho (JP); Atsushi Hosogane, Iwama (JP); Hideyuki Aoki, Takasaki (JP); Naoto Ban, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/390,412

(22) Filed: Mar. 18, 2003

(65) Prior Publication Data

US 2003/0189439 A1 Oct. 9, 2003

Related U.S. Application Data

(60) Continuation of application No. 10/057,921, filed on Jan. 29, 2002, now Pat. No. 6,548,315, which is a division of application No. 09/534,302, filed on Mar. 23, 2000, now Pat. No. 6,358,762.

(30) Foreign Application Priority Data

Sep. 27, 1999 (JP) .......................................... 11-271805

(51) Int. Cl.[7] ............................................... G01R 31/02
(52) U.S. Cl. ......................... 324/754; 438/17; 438/667
(58) Field of Search ........................... 438/14; 361/776; 324/754, 65

(56) References Cited

U.S. PATENT DOCUMENTS

| | | | |
|---|---|---|---|
| 5,060,371 A | 10/1991 | Stewart et al. | |
| 5,189,363 A | * 2/1993 | Bregman et al. | 324/754 |
| 5,716,218 A | 2/1998 | Farnworth et al. | |
| 5,731,708 A | * 3/1998 | Sobhani | 324/758 |
| 5,793,117 A | 8/1998 | Shimada et al. | |
| 5,912,555 A | * 6/1999 | Akaike et al. | 324/158.1 |
| 5,969,262 A | * 10/1999 | Ino et al. | 73/827 |
| 6,107,109 A | 8/2000 | Akram et al. | |
| 6,249,136 B1 | 6/2001 | Maley | |
| 6,262,570 B1 | * 7/2001 | Akaike et al. | 324/158.1 |
| 6,300,786 B1 | 10/2001 | Doherty et al. | |
| 6,548,315 B2 | * 4/2003 | Kohno et al. | 438/17 |
| 6,573,702 B2 | * 6/2003 | Marcuse et al. | 324/158.1 |

* cited by examiner

*Primary Examiner*—John Niebling
*Assistant Examiner*—Andre' Stevenson
(74) *Attorney, Agent, or Firm*—Antonelli, Terry, Stout & Kraus, LLP

(57) ABSTRACT

A semiconductor inspection apparatus which is possible to inspect a plurality of semiconductor devices collectively at one time, which has conventionally been difficult because of precision or the like of probes. A method of manufacturing the semiconductor inspection apparatus comprises the steps of forming a cover film on a surface of the silicon substrate and forming a plurality of probes of a polygonal cone shape or a circular cone shape through etching after patterning by photolithography, after the cover film is removed, again forming a cover film on the surface of the silicon substrate and forming a beam or a diaphragm for each probe through etching after patterning by photolithography, after the cover film is removed, again forming a cover film on the surface of the silicon substrate and forming a through hole corresponding to the probe through etching after patterning by photolithography, and after the cover film is removed, forming an insulating film on the surface of the silicon substrate, forming a metal film on a surface of the insulating film, and forming a wiring lead through etching after patterning by photolithography.

5 Claims, 15 Drawing Sheets

SEMICONDUCTOR INSPECTION APPARATUS

CROSS REFERENCE TO RELATED APPLICATIONS

This application is a Continuation Application of application Ser. No. 10/057,921, filed Jan. 29, 2002, now U.S. Pat. No. 6,548,315 which application was a Divisional Application of application Ser. No. 09/534,302, filed Mar. 23, 2000, now U.S. Pat. No. 6,358,762.

BACKGROUND OF THE INVENTION

1. Field of the Invention

The present invention relates to a method of inspecting semiconductor elements or semiconductor devices formed on a wafer, and more particularly to an inspection apparatus for measuring electrical characteristics during semiconductor manufacture processes such as probing inspection and burn-in inspection.

2. Description of the Related Art

Manufacture processes for semiconductor elements such as ICs (Integrated Circuits) and LSIs (Large Scale Integrated circuits) are roughly classified into pre-processes until circuits are formed on a silicon wafer surface and post processes until the silicon wafer is scribed into separate chips which are sealed by resin, ceramic or the like. At a predetermined stage during the pre-process, the electrical characteristics of each circuit of a semiconductor device is inspected to judge whether each chip is good or defective. The electrical characteristic inspection is divided into probing inspection for judging conduction error between circuits and burn-in inspection for selecting defective circuits at an accelerated speed by applying thermal and electrical stress to the circuit at a high temperature of about 150° C.

Both the probing inspection and burn-in inspection use generally similar connection means for the connection between a test wafer and an external inspection system. More specifically, conductive fine probes are mechanically pushed against electrode pads made of aluminum alloy or another alloy patterned on a test wafer at a pitch of several tens $\mu$m to several hundreds $\mu$m and having a square shape of several tens to several hundreds $\mu$m and about 1 $\mu$mm thick.

The structure of a conventional probe is shown in FIGS. 13 and 14.

In the example shown in FIG. 13, each probe 141 is generally made of tungsten and having a fine needle with its tip diameter of several tens $\mu$m and a length of several tens mm. The probe 141 is fixed to a substrate 142 or insulating jig 143 or deformed in order that its tip is aligned to a corresponding electrode pad on a test wafer.

In the example shown in FIG. 14, each probe 151 is a metal projection formed on the surface of an organic thin film 152 such as a polyimide film. The metal projection is a semisphere metal projection formed mainly by a repetition of a plating process or a conical metal projection formed by using an anisotropically etched hole in a silicon substrate as the plating mold. A set of such projections are formed on the surface of the organic thin film 152.

Means for solving the problems of these two conventional techniques to be described later is made public in the publications JP-A-6-123746, JP-A-7-7052, JP-A-8-50146, and JP-A-9-243663.

In the publication JP-A-6-123746, notches are formed in an elastically deformable card and a plurality of elastically deformable probe needles are uniformly formed. The tip of each probe needle is formed with a plurality of contact members capable of contacting an electrode of a semiconductor element.

In the publication JP-A-7-7052, an electrical characteristic measuring probe has a cantilever structure made of at least one of a single crystal silicon layer, a silicon oxide layer, a silicon nitride layer, a polysilicon layer and a metal layer. The surface of the cantilever structure is coated with a conductive metal film and held by an insulating substrate with a conductive wiring pattern, to thereby use it as the probe.

In the publication JP-9-243663, a silicon substrate worked to have a diaphragm is formed with a plurality of contact probes on the contact surface of the diaphragm. Elastomer is coated on the diaphragm to form an electrical characteristic measuring probe.

SUMMARY OF THE INVENTION

The conventional method of inspecting a semiconductor device as described above has the following problems.

With the probe structure shown in FIG. 13, it takes a long time to align and fix each probe with a high precision, and mass production of inexpensive probe structures is difficult. In addition, a number of regions for aligning and fixing respective probes are necessary. It is therefore difficult to dispose a number of probes on a substrate, and the number of electrode pads or chips capable of being inspected collectively at one time is limited. Further, since the length of each probe is as long as about several tens mm, the parasitic capacitance of each probe is large so that it is practically impossible to inspect a high speed device of about 100 Mhz.

Still further, the radius of curvature of each probe tip is large. In order to break the insulating natural oxide film formed on the surface of an electrode pad of a test wafer, it is necessary to apply a large pressure load and scribe the electrode pad surface. Therefore, the probe tip is fast to be abraded, the life time (durable inspection times) of the probe is short, and electrode pad dusts generated during scribing may contaminate the semiconductor device manufacture environment.

With the probe structure shown in FIG. 14, probes are disposed at a fine pitch on the surface of the organic thin film such as polyimide, in correspondence with the positions of electrode pads of a test wafer. If there is a variation in warp of test wafers or in height of probes, it is difficult to absorb each distance variation between the probe and a corresponding electrode pad. The probe uses as its base member the organic thin film such as a polyimide film whose coefficient of linear expansion is greatly different from that of a test wafer. Therefore, in the burn-in inspection at a high temperature of about 150° C., there is a large difference of linear expansion coefficient between the probe and test wafer, so that position misalignment may exist between the probe and the electrode pad positioned remotely from the center of the test wafer.

According to the publication of JP-A-6-123746, the card is made of synthetic resin or metal. It is therefore difficult to align probes at a fine pitch corresponding to the positions of electrode pads of a test wafer, i.e., difficult to form a plurality of probe needles each being elastically deformable.

In the publication of JP-A-7-7052, each cantilever probe made of a silicon based member is bonded to the surface of another insulating substrate. Therefore, a manufacture yield is low and the height of respective probes is irregular.

In the publication of JP-A-9-243663, it is described that the diaphragm formed on the silicon substrate deforms in conformity with deformation of a test wafer, because of use of elastomer (elastic material). However, this approach does not consider a variation in thicknesses of diaphragms. If a diaphragm having a variation in warp or thickness is deformed, the height of the contact probe cannot be controlled. Since the depth direction of the electrical characteristic measuring pad of a test wafer cannot be controlled, some area of the pad does not contact the probe if a pressure force is insufficient. Conversely, if the pressure force is too large, the probe may move deep under the pad and the test wafer may be broken.

In each of the probe structures described above, electrical wiring leads between the tips of probes and an external inspection system are formed on the same surface as the probe forming surface of the substrate. It is therefore necessary to form all external contact terminals to be concentrated on the outer peripheral area of the substrate. The area capable of forming external contact terminals is therefore limited, and it is difficult to electrically connect a number of probes to the external. It is difficult to perform a broad area simultaneous inspection, such as inspection of all electrode pads of a test wafer collectively at one time.

It is an object of the present invention to solve many problems described above and provide an apparatus and method of inspecting the electrical characteristics of a semiconductor device, capable of inspecting collectively at one time all electrode pads in a large area of, for example, a test wafer, to thereby improve manufacture yield, lower manufacture cost and provide a semiconductor apparatus which is inexpensive and highly reliable.

In order to achieve the above object, in a method of inspecting a semiconductor element by directly contacting the element to an inspection apparatus according to an aspect of the present invention, a beam structure or a diaphragm structure is formed on a substrate with probes, the structure being capable of deforming the probes by a pressure force, and a mechanism for pressing or fixing a test wafer with electrode pads of test semiconductor elements or a mechanism for pressing the probes on the substrate or the probe peripheral areas, is provided. The substrate with the probes is made of silicon, and the probe is made of silicon, metal or a compound thereof, and a wiring lead of conductive material extends to the back surface of the probe forming substrate by using an intermediate insulating member. A flat portion is formed at the tip portion of the probe so that the probe height can be made constant with a high precision.

It is preferable to from a probe on an independent both-end supported beam. The structure may be used in which a beam of a swastika-shape is formed around the probes disposed in an central area of a chip. The structure including the beam is formed by anisotropic etching or dry etching. For the dry etching, an inductively coupled plasma—reactive ion etching (ICP-RIE) system is used so that the space between beams can be narrowed and the narrow pitch between devices can be dealt with.

The wiring lead is passed through an inspection wafer via a through hole formed by anisotropic etching or dry etching, and the probe forming surface of the substrate and the back surface thereof are electrically wired by utilizing sputtering, vapor deposition, or plating. The through hole of the inspection wafer is preferably formed by dry etching. Very inexpensive semiconductor elements or electronic components can be provided by using the above-described inspection structure and method.

DETAILED DESCRIPTION OF THE EMBODIMENTS

Figure 1:
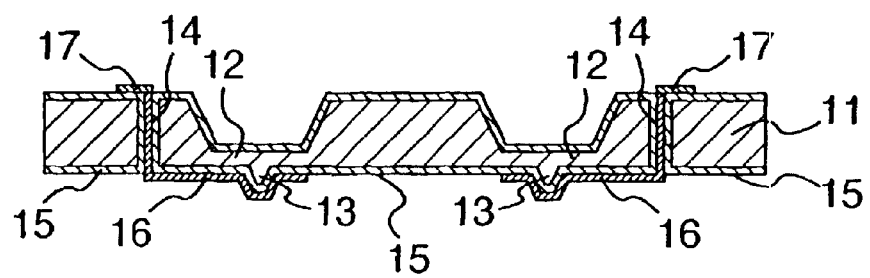
FIG. 1 is a cross sectional view of an inspection wafer according to an embodiment of the invention.

Embodiments of the invention will be described with reference to the accompanying drawings. FIG. 1 is a cross sectional view of the structure of an inspection wafer of a semiconductor inspecting apparatus according to an embodiment of the invention.

An inspection wafer 11 has a both-end supported beam or diaphragm (hereinafter, the term diaphragm is used) 12, probes 13, and through holes 14. The probe 13 is formed on the diaphragm 12 and projects downward from the bottom surface of the inspection wafer 11. The through hole 14 is formed as many as the number of probes 13. The whole surface of the inspection wafer 11 is covered with a silicon oxide film 15. The probe 13 and wiring lead 16 are formed on the silicon oxide film 15. The wiring lead 16 extends from the probe 13 via the through hole 14 to a secondary electrode pad 17 formed on the opposite surface of the inspection wafer 11.

Figure 2:
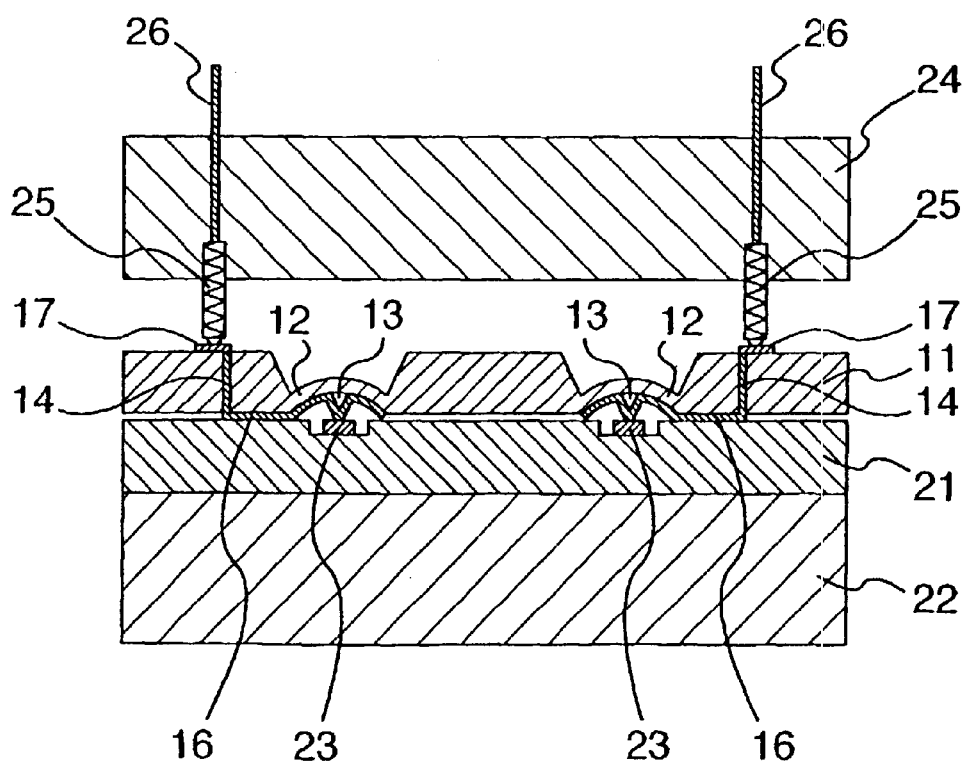
FIG. 2 is a cross sectional view of an inspection apparatus structure according to the embodiment of the invention.

FIG. 2 is a cross sectional view showing the structure of a semiconductor inspection apparatus according to the embodiment of the invention.

A test wafer 21 is vacuum-sucked toward a wafer fixing stage 22 capable of being moved in X-, Y-, Z- and θ-directions by an unrepresented drive mechanism. The wafer fixing stage 22 can highly precisely align the probe 13 formed on the inspection wafer 11 shown in FIG. 1 with a primary electrode pad 23 formed on the test wafer 21.

A pressure mechanism support substrate 24 is formed with a connection terminal 25 generally called a spring probe of an elastic structure and an internal wiring lead 25 in order to electrically connect the secondary electrode pad 17 formed on the inspection wafer 11 and an external terminal. After the spring probe 25 and secondary electrode pad 23 are aligned in position and connected together, the pressure mechanism support substrate 24 and inspection wafer 11 are fixed. Next, the inspection wafer 11 fixed to the pressure mechanism support substrate 24 is pushed against the test wafer 21 sucked to the wafer fixing stage 22.

In the above manner, the primary electrode pad 23 and probe 13 are made in contact with each other and the diaphragm 12 is deformed. Therefore, a constant load is applied between the probe 13 and primary electrode pad 23, so that the electrical characteristics can be inspected uniformly for all probes. Although the drive mechanism for moving the wafer fixing stage 22 in the X-, Y-, Z- and θ-directions is used, such a driving mechanism may be provided to both the wafer fixing stage 22 and wafer fixing stage 22.

In the above description, the secondary electrode pad 17 formed on the inspection wafer 11 is connected to the external electrode via the spring probe 25. Instead, a solder bump may be used in place of the spring probe 25.

Figure 3:
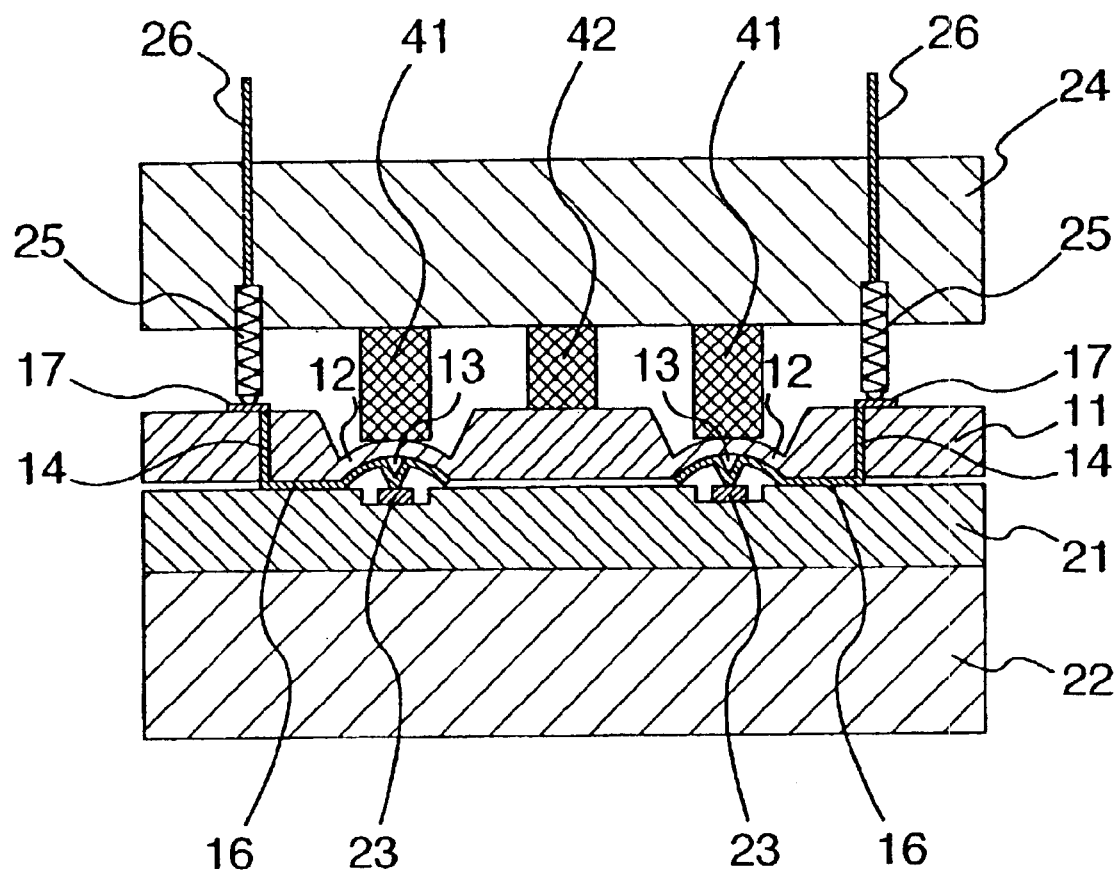
FIG. 3 is a cross sectional view of an inspection apparatus structure according to another embodiment of the invention.

FIG. 3 is a cross sectional view of the structure of the semiconductor inspection apparatus shown in FIG. 2 added with a pressure mechanism.

If a sufficient pressure force to the diaphragm is difficult by using only the spring probe 25 or solder bump, elastomer members 41 and 42 are formed on the diaphragm 12 to press other portions of the inspection wafer 11. Elastic structure members other than the elastomer members 41 and 42 may also be used. The silicon oxide film covering the whole surface of the inspection wafer 11 is omitted in FIGS. 2 and 3.

FIGS. 4A to 4F are cross sectional views illustrating a process of manufacturing an inspection wafer according to an embodiment of the invention.

Figure 4A:
FIGS. 4A to 4F are cross sectional views illustrating a process of manufacturing an inspection wafer according to an embodiment of the invention.

FIG. 4A: A silicon wafer substrate 11 has a diameter of 8 inches and a thickness of 600 μm, and preferably has the same shape as the test wafer 21 because of lower manufacture cost and reduced space of the inspection apparatus. For example, if the test wafer 21 has a diameter of 8 inches, it is preferable to use the inspection wafer 11 having a diameter of 8 inches.

Figure 4B:
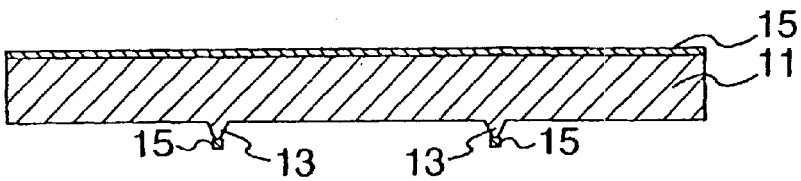

FIG. 4B: On the surface of the silicon wafer 11, a silicon oxide film 15 having a thickness of 0.7 μm is formed. Thereafter, a silicon etching pattern is formed through photolithography. Namely, photoresist is coated on the silicon oxide film 15 and exposed, developed and etched by using a patterned photomask, to partially remove the silicon oxide film 15 and form a silicon oxide film pattern having openings. Next, anisotropic etching is performed by using potassium hydroxide aqueous solution of 35% at 80° C. to etch the silicon wafer 11 via the openings of the silicon oxide film pattern and form a probe 13 having a height of 50 μm.

Instead of the silicon oxide film 15 used for etching the silicon wafer 11, a silicon nitride film may also be used. Instead of using potassium hydroxide aqueous solution as etchant of the silicon wafer 11, other anisotropic etchant may also be used such as tetramethylammonium hydroxide, ethylenediamine pyrocatechol, and hydrozine.

Figure 4C:
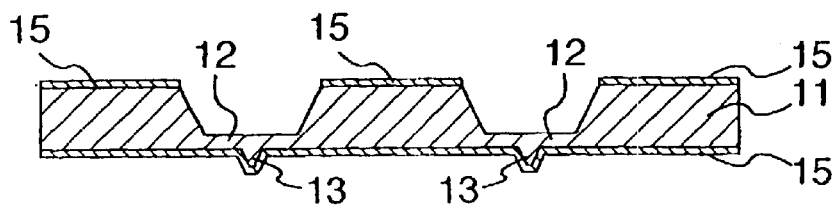

FIG. 4C: After the silicon oxide film pattern is removed, a silicon oxide film 15 having a thickness of 1 μm is again formed on the whole surface of the silicon wafer 11. Similar to the process FIG. 4B, a silicon etching pattern is formed through photolithography, and a diaphragm 12 is formed having a thickness of 100 μm and a length of 2 mm through anisotropic etching.

Figure 4D:
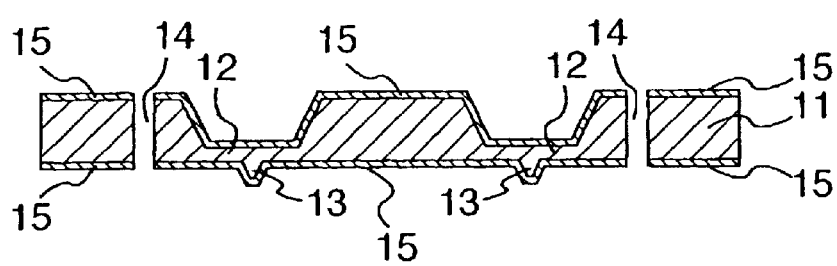

FIG. 4D: The silicon oxide film pattern is removed, and thereafter a silicon oxide film 15 is formed over the whole surface of the silicon wafer 11. A silicon etching pattern is formed through photolithography, and then through holes 14 are formed by using a reactive ion etching (RIE) system. The diameter of the through hole 14 is 100 μm. The diameter may be set to another value if a necessary number of electrode pads can be formed in an area corresponding to that of each semiconductor chip.

Figure 4E:
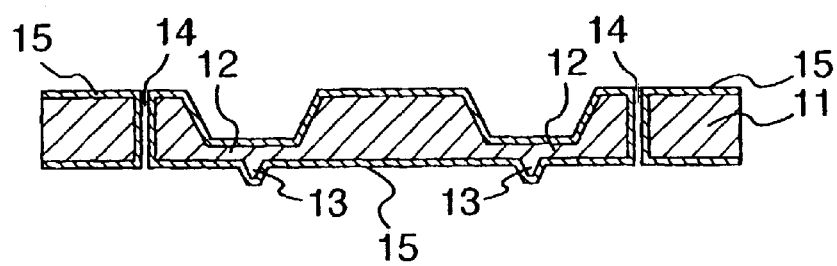

FIG. 4E: The silicon oxide film pattern is removed, and thereafter a silicon oxide film 15 is formed to a thickness of 0.5 μm over the whole surface of the silicon wafer 11. This silicon oxide film 15 prevents the current flowing in the wiring lead 16 interconnecting the probe 13 and secondary electrode pad 17 from leaking into the inspection wafer. The thickness may be set to a different value. Instead of the silicon oxide film, another insulating film may also be used if it does not melt at 150° C. or higher.

Figure 4F:
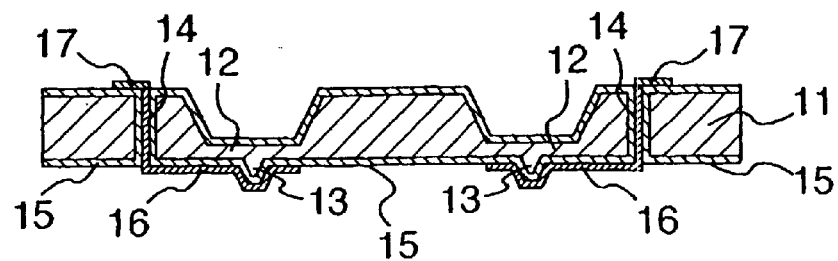

FIG. 4F: A photoresist pattern is formed on the surface of the silicon oxide film 15 through photolithography. Thereafter, a chrome film is formed 0.1 μm thick and then a nickel film is formed 1 μm thick over the whole surface of the silicon wafer 11 by using a sputtering system. The photoresist and the chrome film and nickel film on the photoresist are removed by lift-off to form the wiring lead 16 and secondary electrode pad 17.

The film forming system for the wiring lead 16 and secondary pad 17 is not limited only to the sputtering system, but other systems such as a vacuum deposition system and a chemical vapor deposition (CVD) system may also be used. The method of forming the wiring lead 16 and secondary electrode pad 15 is not limited only to lift-off, but they may be formed by forming an insulating film on the whole surface of the inspection wafer 11, forming a wiring thin film on the whole surface, and then etching unnecessary portions after photolithography. This etching process may be wet etching using etchant or dry etching using an ion milling system or the like. The material of the wiring lead is selected from those materials not melting at 150° C. or higher, having conductivity and being capable of forming a thin film, such as gold, copper, platinum, titanium, cobalt, molybdenum, and tungsten.

FIGS. 5A to 5F are side and plan views showing the shapes of probes.

Figure 5A:
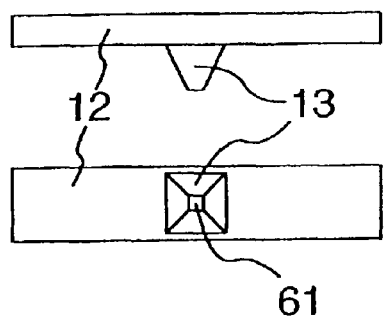
FIGS. 5A to 5F are side views and plan views of probes according to an embodiment of the invention.

FIG. 5A shows a probe 13 formed on the diaphragm 12 through anisotropic wet etching. The anisotropic wet etching utilizes a different etching rate of each silicon crystalline plane in alkali based etchant. If a silicon wafer having the (100) plane is used, a probe 13 of a tetragonal pyramid surrounded by the (100) and (111) planes is formed.

Figure 5B:
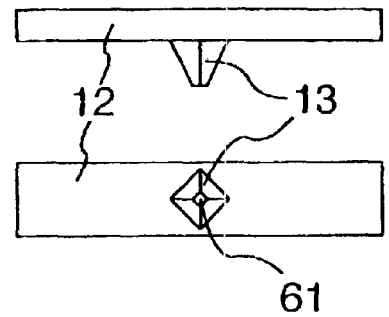

FIG. 5B shows a probe with an etching degree greater than FIG. 5A. On edges where the (100) and (100) planes and the (100) and (111) planes meet, a number of crystalline planes other than the (100) and (111) planes appear. Therefore, the shape of the probe has crystalline planes having a faster etching rate such as (110) and (311) planes than the (100) and (111) planes.

Figure 5C:
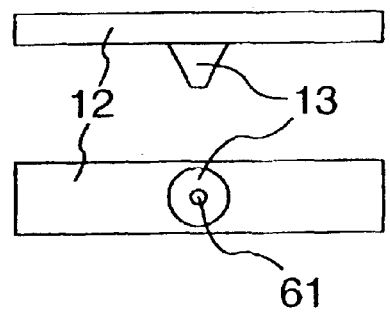

FIG. 5C: This probe shown in FIG. 5C is formed by the following process. After a cylindrical projection is formed through dry etching by using a RIE system, a mask pattern of silicon oxide or the like is formed on the surface of the diaphragm 12 and on the top portion of the cylindrical projection. Then, dry etching using an ion milling system or the like is performed by slanting the silicon wafer to form a conical probe. In this case, the dry etching is preferably performed by rotating the slanted silicon wafer about itself and about a rotation center.

Figure 5D:
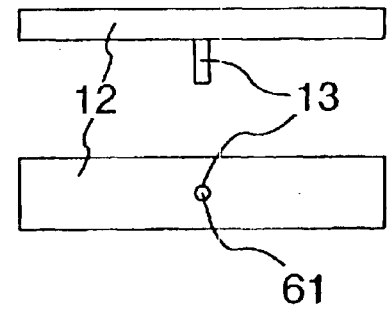
Figure 5E:
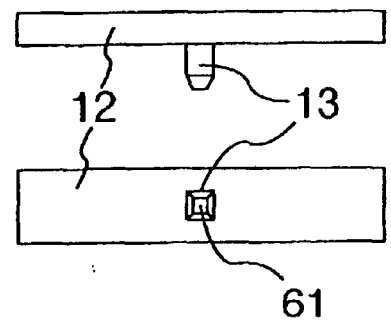
Figure 5F:
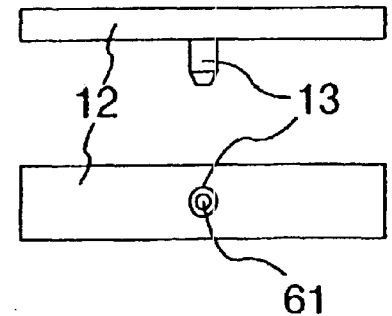

FIG. 5D: This probe shown in FIG. 4D having a cylindrical shape having the same diameter from the top to bottom thereof is formed through dry etching using an RIE system or the like. The probes shown in FIGS. 4E and 4F are formed through composite etching combining anisotropic wet etching and dry etching. The probe shown in FIG. 4E is formed by the combination of the processes of FIGS. 4A and 4D, and the probe shown in FIG. 4F is formed by the combination of the processes of FIGS. 4C and 4D. Any shape of the probe 13 may be used. However, with a given height of the probe 13, the methods illustrated in FIGS. 4A to 4C cannot make the pitch between probes two narrow, because the contact area of the probe 13 with the diaphragm 12 is large as compared to the top surface area of the probe 13.

If the pitch between probes is narrow, the shapes shown in FIGS. 4D to 4F are preferable. However, in this case, the mechanical strength is inferior to those shown in FIGS. 4A to 4C. It is preferable therefore that the shape of the probe 13 is determined by considering the pitch between primary electrode pads, a pressure force, a deflection amount of the beam or diaphragm, a probe height and the like.

It is preferable that the top portion of the probe 13 shown in FIGS. 4A to 4F in contact with the primary electrode pad is provided with a flat portion which was not etched while the probe 13 is formed. If the tip of the probe 13 is made sharp without leaving a flat portion by anisotropic wet etching, the etching mask is removed at the same time when the sharp edge is formed. In this case, the height of the tip of the probe 13 cannot be controlled uniformly because there is a variation of several % of an etching rate of etching the silicon wafer even in the case of anisotropic wet etching, unless the etchant temperature and the like are managed precisely.

If the flat portion is formed at the top portion of the probe 13, the height of the probe 13 can be controlled uniformly. Therefore, when the primary electrode pad 23 of the test wafer 21 is made in contact with the probe 13 of the inspection wafer 11, the displacement amount of all diaphragms 12 of the inspection wafer 11 becomes constant. The load of all probes 13 of the inspection wafer 11 is therefore constant, and it is possible to perform an inspection uniformly and highly precisely for all primary electrodes of the test wafer. The shape of the flat portion 61 at the top portion of the probe 13 is not limited only to a rectangle and a circle, but other polygonal shapes may be incorporated.

Figure 6A:
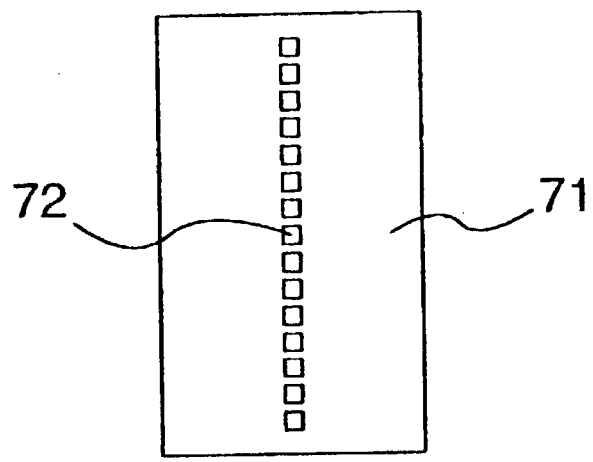
FIGS. 6A and 6B are plan views showing the layouts of electrode pads of semiconductor chips.
Figure 6B:
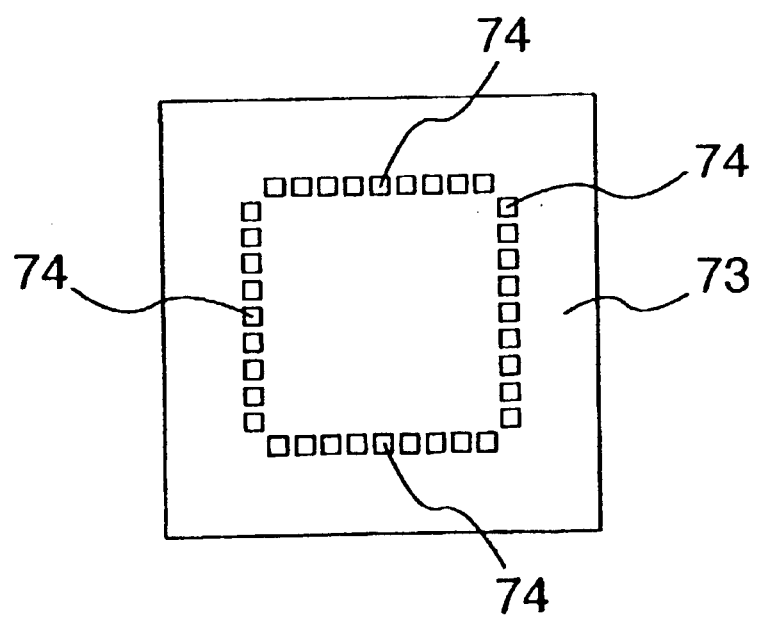

FIGS. 6A and 6B show the layouts of primary electrode pads formed on semiconductor chips.

The pad layout is classified into the layout shown in FIG. 6A in which electrode pads 72 are disposed generally straight along a center line of a semiconductor chip mainly for dynamic read only memories (DRAMs) and the layout shown in FIG. 6B in which electrode pads 74 are disposed generally straight along each side of a semiconductor chip mainly for microcomputer chips. In both the layouts shown in FIGS. 6A and 6B, the size of each of the electrode pads 72 and 73 is several tens $\mu$m square to several hundreds $\mu$m square, and the pitch between pads is from several tens $\mu$m to several hundreds $\mu$m.

FIGS. 7A to 7F show the structures of beams or diaphragms according to the invention.

Figure 7A:
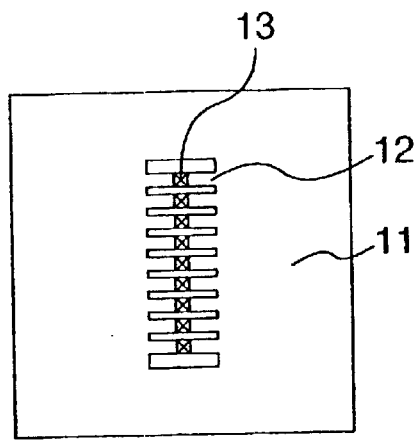
FIGS. 7A to 7F are plan views showing beams or diaphragms according to the invention.
Figure 7B:
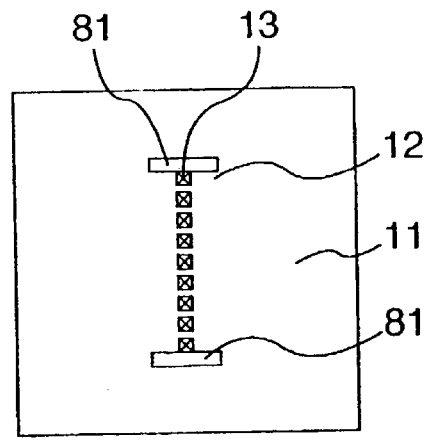
Figure 7C:
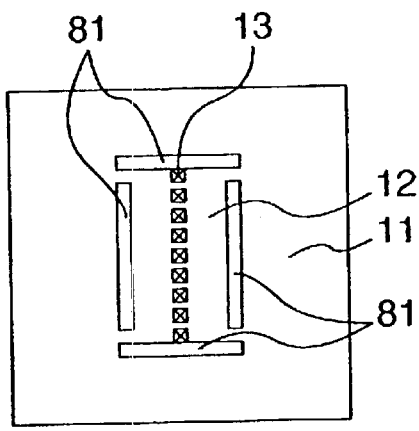

The structures shown in FIGS. 7A to 7C are used for semiconductor chips having electrode pads disposed straight along the center line of chips. FIG. 7A shows the both-end supported beam structure of this invention. Each both-end supported beam formed on the inspection wafer 11 has a single probe 13. The pitch between probes corresponds to that between primary electrode pads. The beam width, length and thickness are made the same for all probes to make the load applied to each probe constant.

FIG. 7B shows the diaphragm structure of this invention. Slits 81 are formed on opposite ends of a train of probes 13 to make the deflection amount of the diaphragm 12 uniform and the load applied to each probe 13 constant. This structure is effective for the narrow pitch between primary electrode pads and for the case wherein the probe load is to be increased with the same space as the both-end supported beam structure.

Figure 7D:
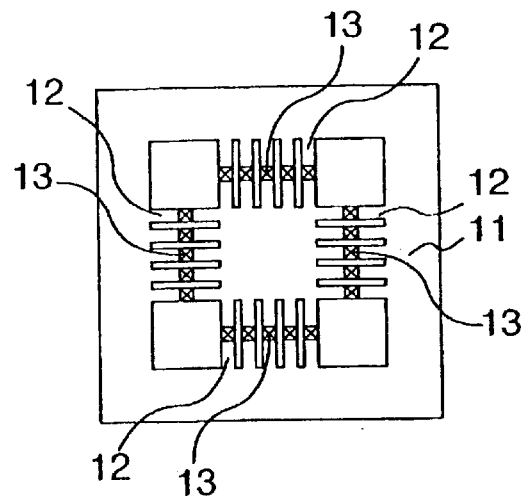
Figure 7E:
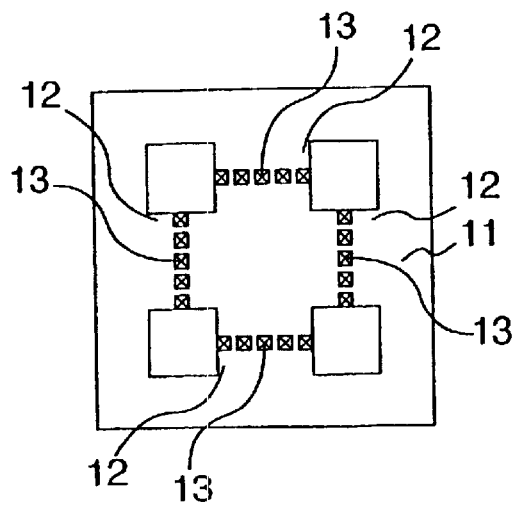
Figure 7F:
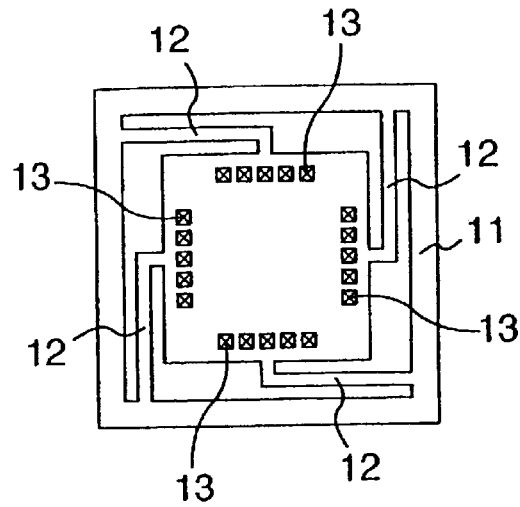

FIG. 7C shows the structure with slits 81 being formed at four sides. This structure is effective for the case wherein although the both-end supported beam structure cannot be employed because of the narrow pitch between primary electrode pads, the probe load is intended to be reduced. The structures shown in FIGS. 7D to 7F are used for semiconductor chips whose primary electrode pads are disposed straight along peripheral four sides. The structures shown in FIGS. 7D, 7E and 7F are modifications of the structures shown in FIGS. 7A, 7B and 7C, respectively. Of these structures shown in FIGS. 7D to 7F, the structure shown in FIG. 7F has a swastika-shaped both-end supported beam 12 interconnecting the central area supporting the probe and the peripheral area to increase the displacement amount of the probe 13. The shape of the beam is not limited to the swastika shape, but a shape allowing a long beam length, such as a spiral shape, may also be used to further increase the displacement amount of the probe.

Figure 8:
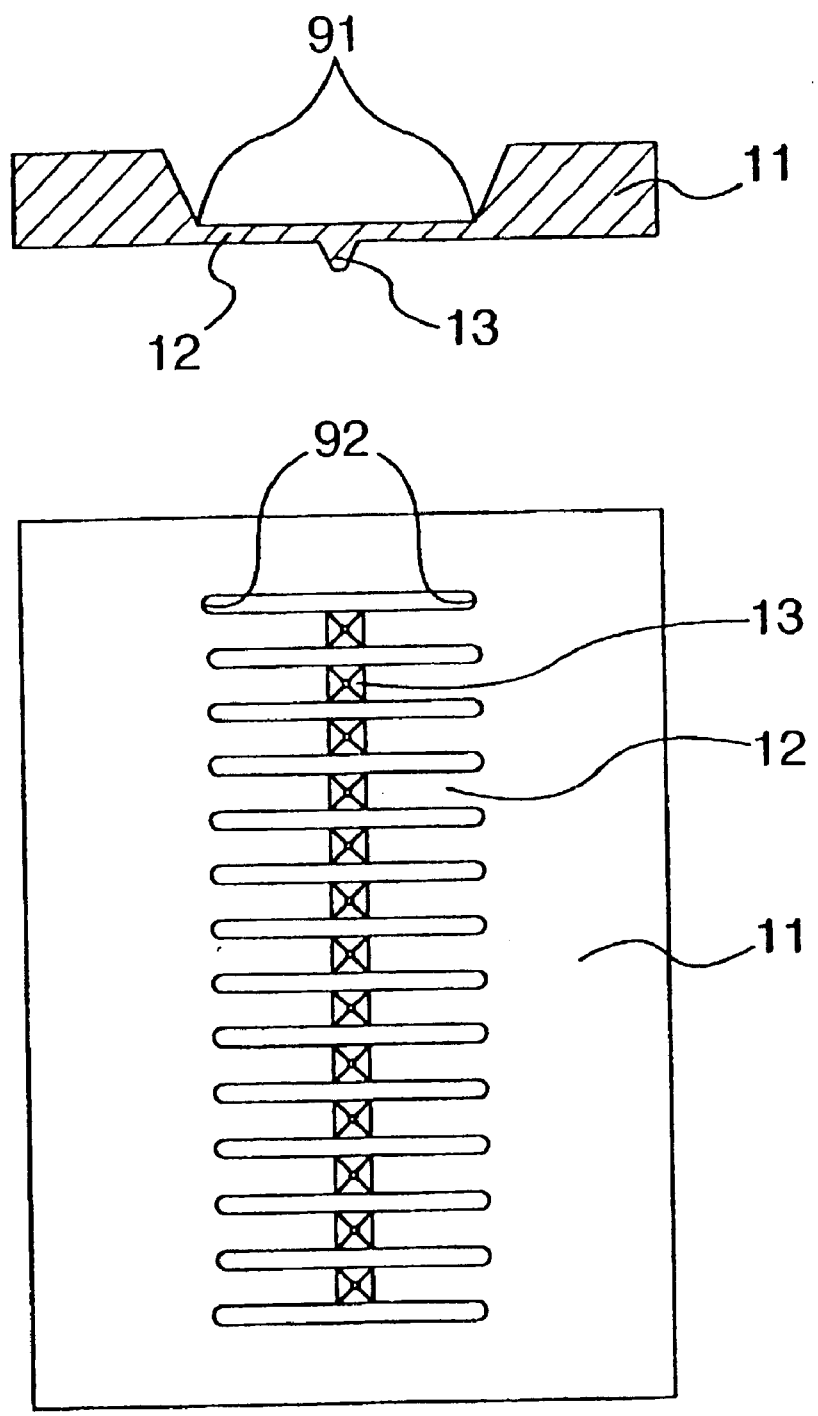
FIG. 8 shows a cross sectional view and a plan view showing an embodiment according to the invention.

FIG. 8 shows a cross sectional view and a plan view showing the structure of the both-end supported beam of this invention.

By rounding the skirt portions 91, 92 of the both-end supported beam 12, the rigidity and durability of the both-end supported beam 12 can be increased and the reliability of repetitive inspection can be improved. Rounding the skirt portions can be realized through dry etching by using an RIE system or the like or through isotropic etching by using mixture solution of hydrofluoric acid, nitric acid and acetic acid. Rounding is effective not only for the both-end supported beam but also for the diaphragm and cantilever.

Figure 9A:
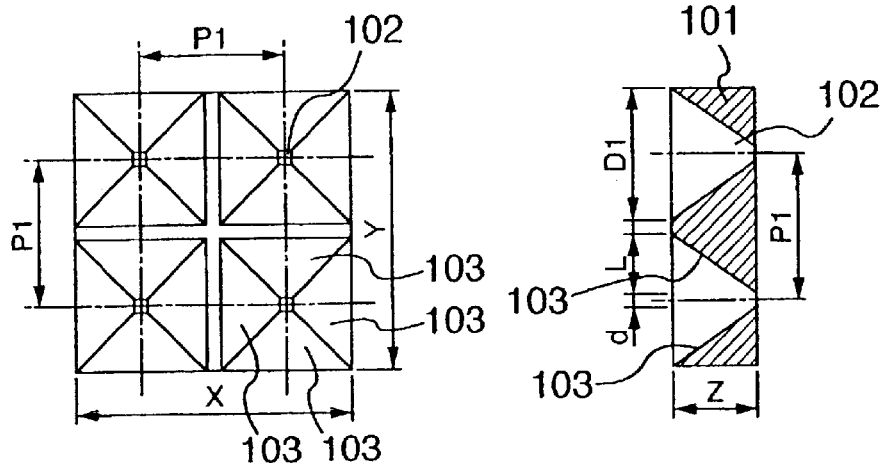
FIGS. 9A to 9C are plan views and cross sectional views showing an embodiment according to the invention.
Figure 9B:
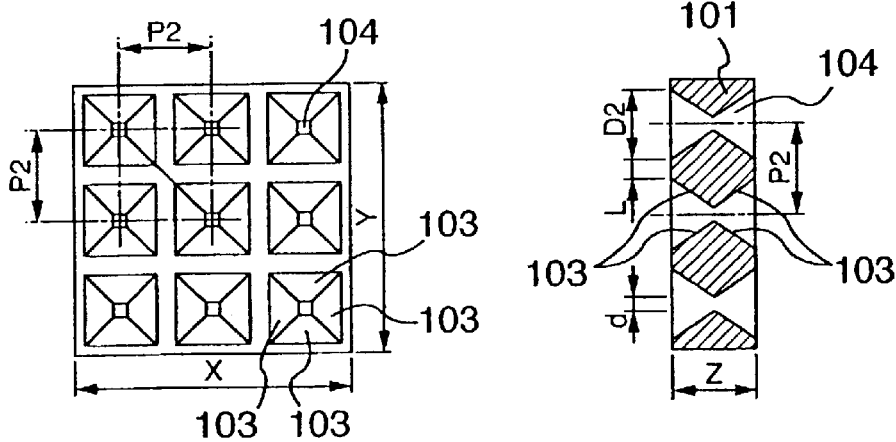
Figure 9C:
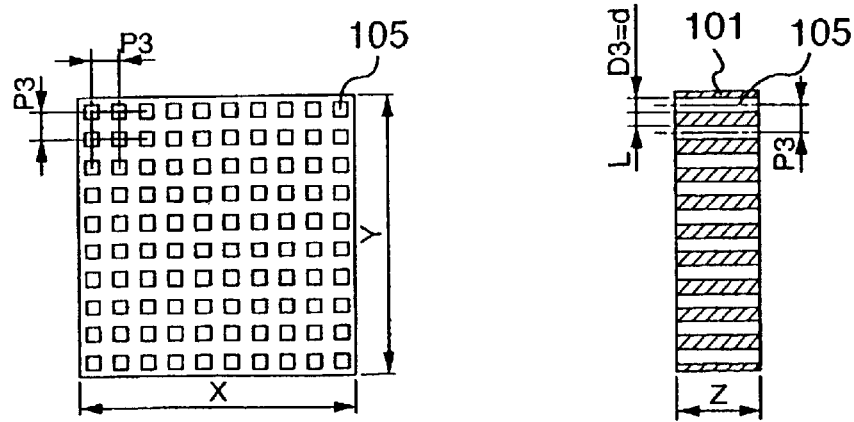

FIGS. 9A to 9C are plan views and cross sectional views showing the shapes of through holes formed by etching. In FIGS. 9A to 9C, through holes having a diameter d=100 $\mu$m are formed through a silicon wafer having the (100) plane and a size of X=2 mm, Y=2 mm and X=600 $\mu$m and disposed at a pitch L=100 $\mu$m in order not to overlap them.

In the structure shown in FIG. 9A, a through hole 102 is formed by etching a silicon wafer 101 from one side thereof by anisotropic wet etching. With the anisotropic wet etching, the through hole 102 has an inverted tetragonal pyramid shape surrounded by four (111) planes 103 having a slope angle of about 54.7°. In this case, D1=2Z/tan54.7°+d=949 $\mu$m and P1=D1+L =1049 $\mu$m. Therefore, only four through holes 102 are formed through the 2 mm square silicon wafer 101.

In the structure shown in FIG. 9B, a through hole 104 is formed by etching a silicon wafer 101 from both sides thereof by anisotropic wet etching and has a drum shape coupling two inverted tetragonal pyramids. In this case, D2=2Z/tan54.7°+d=524 μm and P2=D2+L=624 μm. It is possible to form nine through holes 104 through the 2 mm square silicon wafer 101.

Even if the diameter d of the through holes 102 and 104 of the structures shown in FIGS. 9A and 9B is made small, the number of through holes capable of being formed through the 2 mm square silicon wafer 101 will not change. There is therefore a process limit of anisotropic wet etching.

In the structure shown in FIG. 9C, a through hole 104 is formed by etching a silicon wafer 101 through dry etching by using an RIE system or the like. Since dry etching is used, the through hole has a vertical wall and a cross sectional area same as the shape of a mask pattern. In this case, D3=d=100 μm and P3=D3+L=200 μm. It is possible to form one hundred through holes 105 through the 2 mm square silicon wafer 101.

A process limit of an RIE system is represented in some cases by an aspect ratio (depth/width of a processed workpiece). It is said that an ICP-RIE system has an aspect ratio of 15 to 20. If the silicon wafer 101 having the thickness of 600 μm is processed from one side thereof, the minimum process dimension of the through hole 105 is 30 μm to 40 μm. If the wafer is processed from both sides, the minimum process dimension of the through hole 105 is 15 μm to 20 μm. In this case, it is possible to form several thousand through holes through the 2 mm square silicon wafer 101. It is therefore possible to form through holes same in number as the number of electrode pads of a semiconductor chip at positions just above the electrode pads. The length and resistance of the wiring lead can be shortened and reduced.

Figure 10:
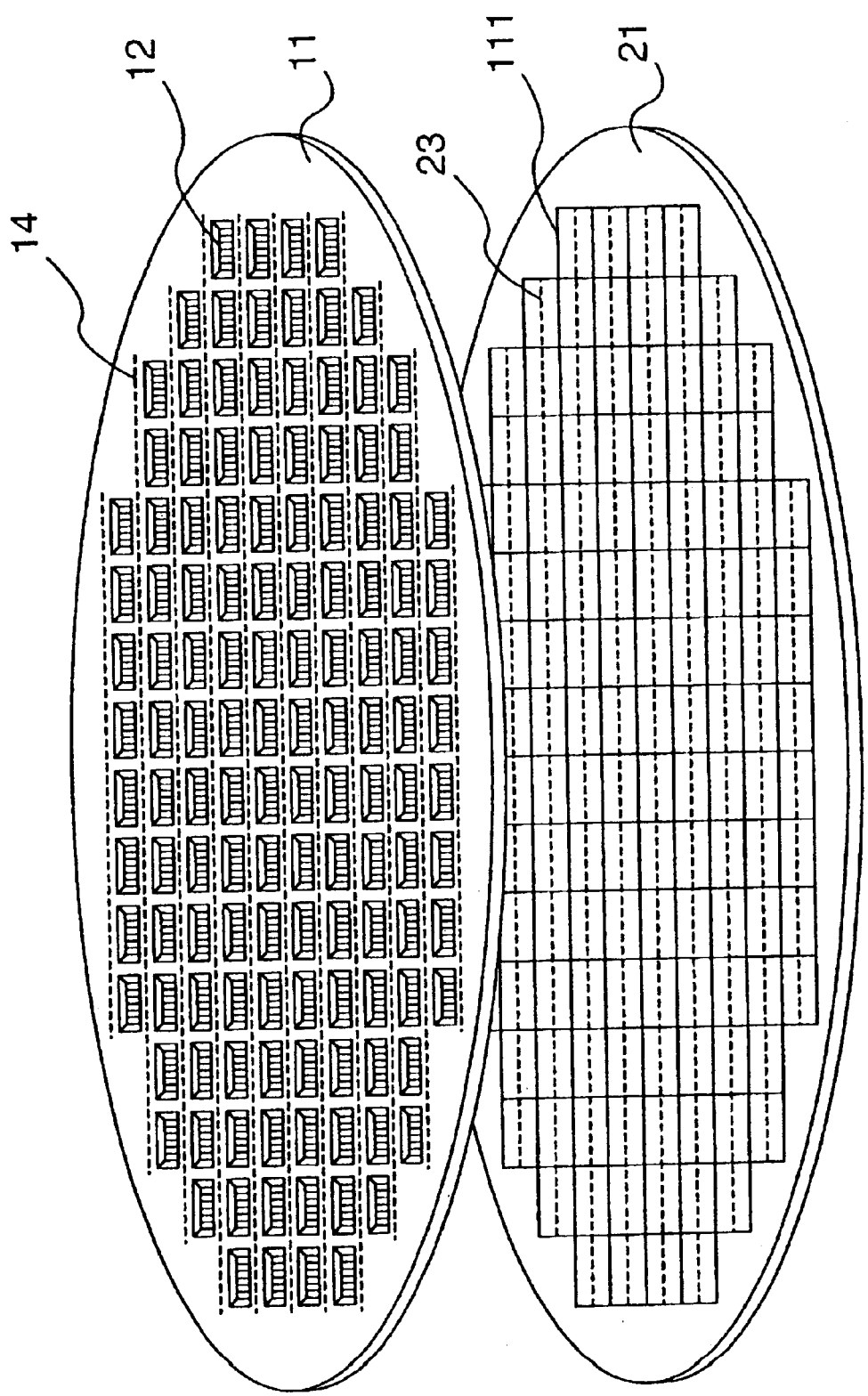
FIG. 10 is a perspective view showing an embodiment of the invention.

FIG. 10 is a perspective view showing the overall outline of an inspection wafer and a test wafer according to the invention. Several hundred semiconductor chips 111 are formed on a test wafer 21, and each semiconductor chip 111 is formed with several tens to several hundreds of electrode pads 23. Both-end supported beams or diaphragms 12 are formed on the inspection wafer as many as the same number of semiconductor chips 111 on the test wafer 21 or more. Each both-end supported beam or diaphragm 12 is formed with probes in correspondence with the electrode pads 23 formed on the semiconductor chip 111. Through holes 14 are formed through the inspection wafer 11 near the beam or diaphragm 12, and a wiring lead from each probe is guided through the through hole 14 to the upper side.

Figure 11:
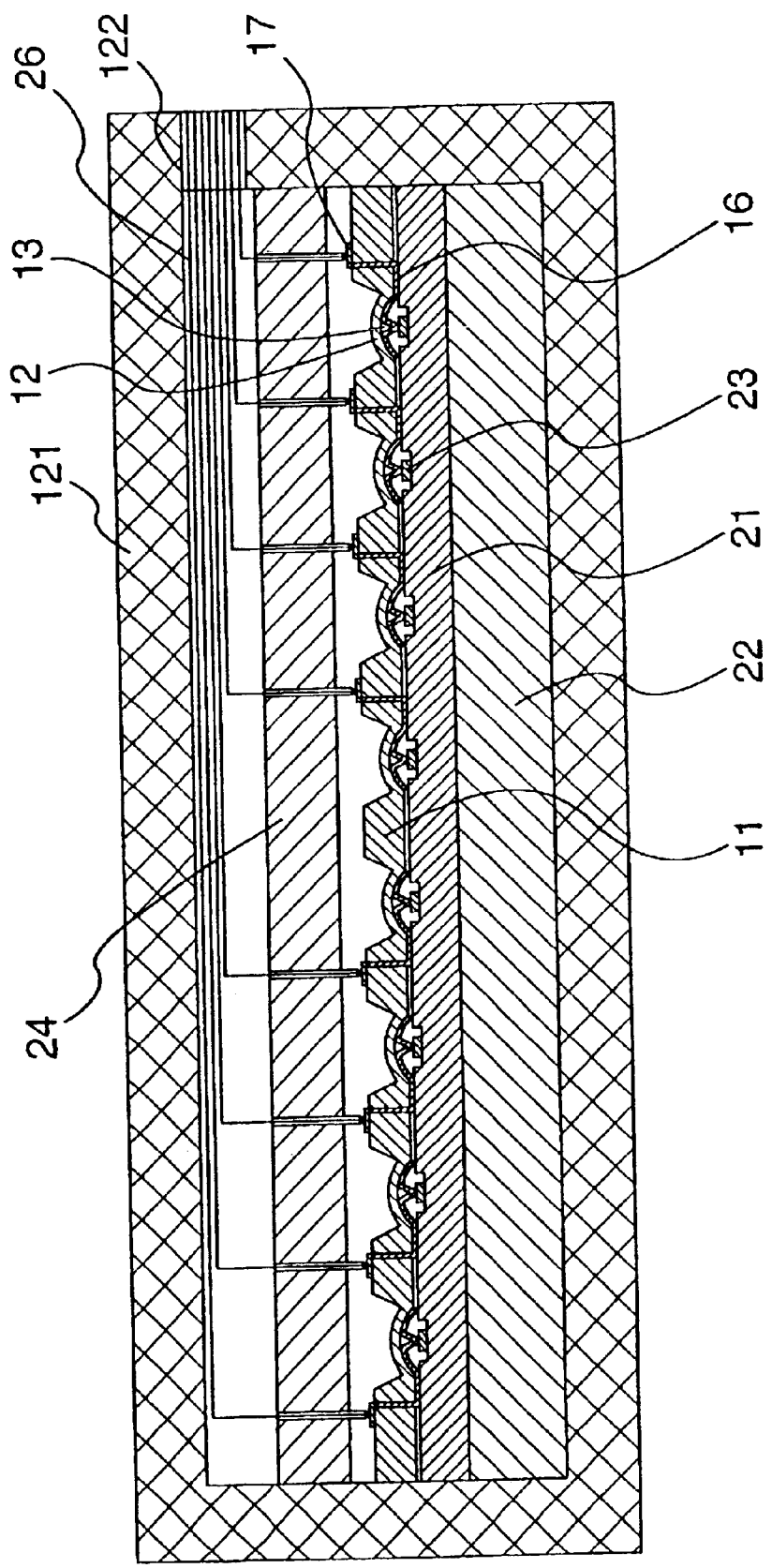
FIG. 11 is a cross sectional view showing an embodiment of the invention.

FIG. 11 is a cross sectional view showing the structure of a burn-in inspection pack according to the present invention. An inspection wafer 11 is formed with both-end supported beams 12 or diaphragms 12 easy to be deformed, and each both-end supported beam 12 or diaphragm 12 is formed with probes 13. The inspection wafer is formed to have the same size as or smaller size than that of the test wafer by using the work process described with FIGS. 5A to 5F. For example, a test wafer having an 8-inch diameter can be inspected collectively at one time by using scribed portions of an inspection wafer having a 6-inch diameter. This approach takes into consideration manufacture yield and the like. For example, even if a portion of the inspection wafer is destroyed, the defective portion can be easily replaced by another portion and the manufacture cost can be reduced.

In a burn-in inspection, the electrical characteristics are measured during a long time at a high temperature of about 150° C. However, since the inspection wafer 11 is made of silicon same as the material of the test wafer 21, position misalignment of probes to be otherwise caused by thermal expansion will not occur. The test wafer 21 is fixed to a wafer fixing stage 22 by a vacuum chuck. The inspection wafer 11 is fixed to a pressure mechanism support substrate 24. The wafer fixing stage 22 can be moved in X-, Y-, Z- and θ-directions so that the test wafer 21 and inspection wafer 11 can be aligned in position with a high precision. After the position alignment, the whole structure is fixed by a burn-in inspection pack 121. The burn-in inspection pack 121 is preferably made of material which is less susceptible to thermal deformation at 150° C. or higher and has a small thermal expansion coefficient difference from silicon, such material being, for example, aluminum nitride and invar.

The burn-in inspection pack 121 is formed with terminals 122 for connection to electrical measurement wiring leads from the contacts between the electrode pads 23 of the test wafer 21 and probes 13 of the inspection wafer 11. Generally, in the burn-in inspection, it is necessary to connect probes of the inspection wafer to all of several tens of electrode pads formed on several hundreds of chips of the test wafer. The electrical measurement becomes easy by using the burn-in inspection pack of this invention.

Figure 12:
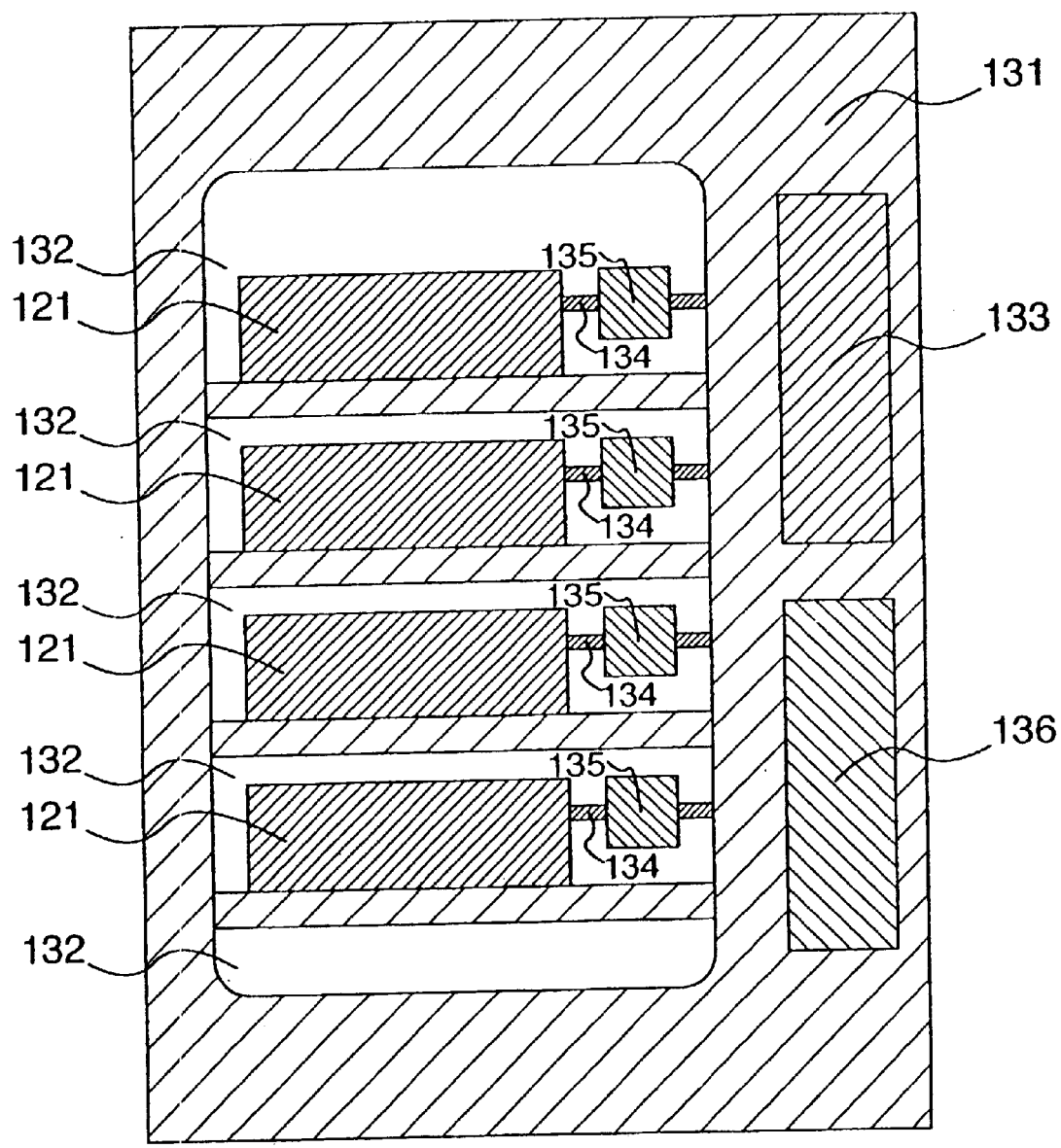
FIG. 12 is a cross sectional view showing an embodiment of the invention.
Figure 13:
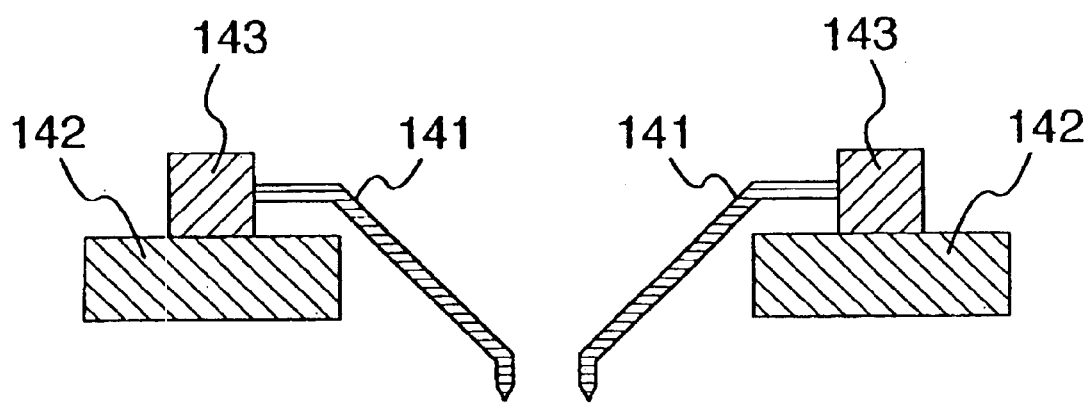
FIG. 13 is a cross sectional view illustrating conventional techniques.
Figure 14:
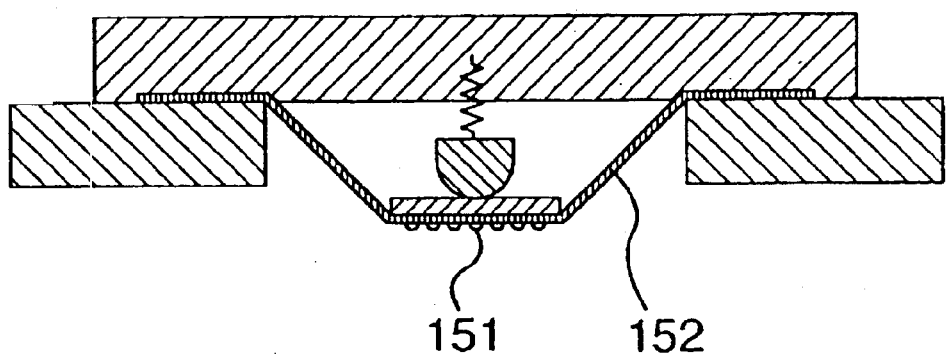
FIG. 14 is a cross sectional view illustrating conventional techniques.

FIG. 12 is a cross sectional view showing the outline of a peripheral system for the burn-in inspection pack according to the invention. A burn-in inspection apparatus 131 has a built-in thermostatic chamber 132 in which a plurality of burn-in inspection packs 121 are accommodated. The temperature in the thermostatic chamber 132 is controlled by a temperature controller 133. Several ten thousands of wiring leads 134 are connected to the burn-in test pack 121 and via a high speed switching circuit 135 to a tester circuit 136. The high speed switching circuit 135 switches between the wiring leads 134 so that the number of input wiring leads to the tester circuit 136 can be reduced.

The high speed switching circuit 135 is made of silicon. Therefore, this circuit 135 may be fabricated in the inspection wafer 11 in the burn-in inspection pack 121 to thereby considerably reduce the number of wiring leads to be extended out of the pack 121.

Techniques associated with the burn-in inspection pack can be applied to a probing inspection apparatus. It is therefore possible to perform an inspection process at the wafer level, to shorten the inspection time and to reduce cost. The number of probes 13 to be formed on the inspection wafer 11 is not limited to the same number as that of contacting electrode pads 72 to be formed on the test wafer 21, but it may be increased more. In this case, even if the probes 13 on the inspection wafer 11 cannot be used because of their life time or the like, the test wafer can be inspected collectively at one time by merely changing the positions of the inspection wafer 11 and test wafer 21.

The invention was applied to the probing inspection apparatus and a burn-in inspection apparatus. The contact resistance of the wiring lead 16 of the inspection wafer was 0.5 Ω or smaller and the inspection frequency was 200 MHz or higher. The life time of the probes 13 was three hundred thousands. Since the invention allows a reliable inspection of electrode pads of a test wafer, this invention is applicable to LSI electrodes and to leads or connection connectors of fine patterns. In this invention, since silicon is used as the material of a substrate for forming probes, resistors, circuits or the like can be fabricated on the substrate when probes are formed on the substrate.

FIGS. 15A to 15E show another embodiment of the invention in which an electronic circuit such as a multiplexer circuit is integrated with the inspection wafer shown in FIG. 1. In this embodiment, on an upper surface US of a silicon substrate SUB opposite to a back surface BS on which probes are formed, insulated gate field effect transistors (IGEFT) NMOSs and PMOSs constituting the electronic circuit, typically MOSFETs, are formed.

Figure 15A:
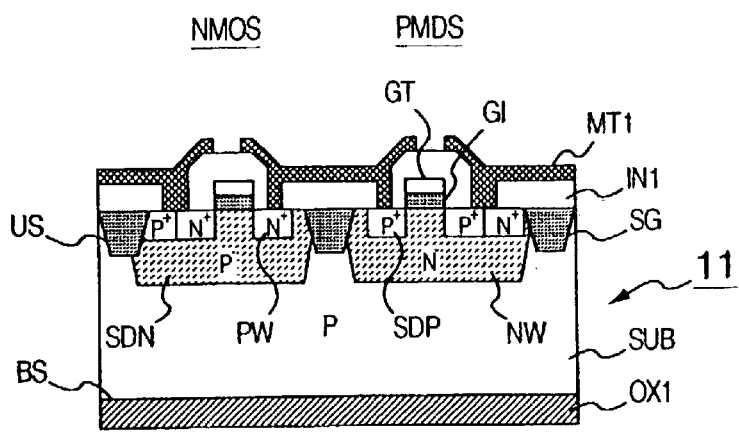
FIGS. 15A to 15E are cross sectional views illustrating an embodiment of the invention.

FIG. 15A shows a complementary integrated circuit (generally called CMOS-IC) made of a number of p-channel IGEFTs (PMOSs) and n-channel IGFETs (NMOSs). In this example, a typical CMOS inverter circuit made of a pair of transistors is shown.

The structure and manufacture method of the inspection wafer 11 will be described sequentially with reference to FIGS. 15A to 15E.

As shown in FIG. 15A, on the back surface BS of the p-type single crystal silicon substrate SUB, a silicon oxide film OX1 is formed by thermally oxidizing the substrate SUB in an oxidizing atmosphere. The surface US of the substrate SUB has the (100) crystalline plane. In the surface US, an n-type well region NW for PMOS and a p-type well region PW are formed. In this example, PMOS and NMOS are electrically separated by a p-n junction reversely biased between the n-type well NW and substrate SUB. After the well regions are formed, a field oxide layer SG is embedded in the surface US. The field oxide layer SG is used for isolating transistors and surrounds an active region in which transistors and the like are formed. A wiring layer is present above the transistors and the like, overriding these. The SG layer is formed to a thickness sufficient for preventing parasitic MOS transistors relative to a maximum voltage applied to the wiring layer. Next, a gate insulating film GI is formed to a thickness of 3 to 50 nm by thermal oxidation. A layer GT is used as a gate electrode and other wiring and formed on the gate insulating film GI. The gate layer GT is made of a single layer of polysilicon doped with boron or phosphorous, a lamination layer of a lower layer of polysilicon and an upper layer of metal or metal silicide, or a single layer of metal. After the gate layer GT is patterned, an n-type high impurity concentration region SDN for NMOS and a p-type high impurity concentration region SDP for PMOS, respectively functioning as source and drain regions and wiring regions, are formed through ion implantation or diffusion, in self-alignment relation with the gate electrode GT. The regions SDN and SDP are used for connecting low impurity concentration well regions NW and PW and a wiring layer MT1 and also are used a guard band around the well for preventing parasitic capacitors. Next, an interlayer insulating film IN1 for dielectric isolation between the gate layer GI and the higher level wiring layer MT1 is formed through chemical vapor deposition (CVD) of silicon oxide doped with phosphorous. Contact holes are formed through the insulating film IN1 through photolithograpy in the areas where the wiring layer MT1 are made in contact with the gate layer GT, and high impurity concentration regions SDN and SDP. Then, the wiring layer MT1 is deposited through sputtering or vacuum deposition of metal such as aluminum, and thereafter patterned by photolithography.

Figure 15B:
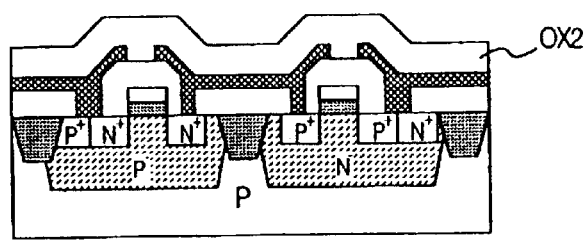

As shown in FIG. 15B, an silicon oxide film OX2 is formed through CVD. This film functions as a passivation film for avoiding water and humidity and also functions as a mask or protective film for the process shown in FIG. 15C and following processes.

Figure 15C:
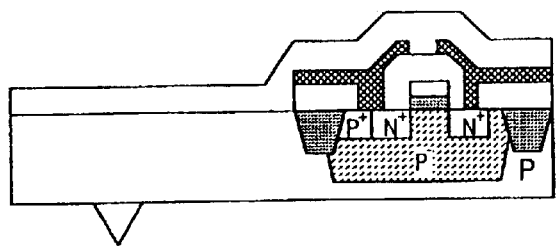

As shown in FIG. 15C, a probe 13 is formed after the device shown in FIGS. 15A is formed, in order to lower a possibility of damages to be caused by the process shown in FIG. 15A having many process steps.

Figure 15D:
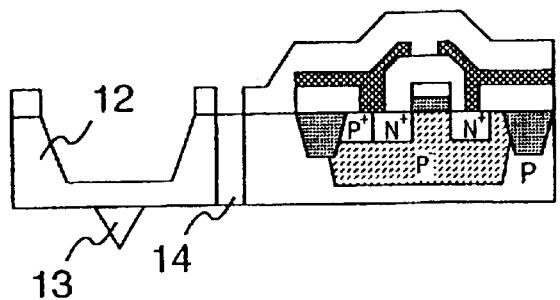

As shown in FIG. 15D, the silicon oxide film OX2 is selectively removed through photolithography and a through hole 14 is formed through RIE as described with FIGS. 4A to 4F. Thereafter, the silicon oxide film OX2 in the area corresponding to the diaphragm 12 is selectively removed through photograph, and the diaphragm 12 is formed through anisotropic etching. The through hole 14 is formed before the diaphragm 12 is formed, because the silicon oxide film OX2 can be used as the mask for both the through hole 14 and diaphragm 12. The through hole 14 is exposed to the etchant during the diaphragm 12 is formed so that the upper portion of the through hole 14 is overetched slightly broader. Next, a silicon oxide film is deposited through CVD (low temperature CVD), covering the inner wall of the through hole 14.

Figure 15E:
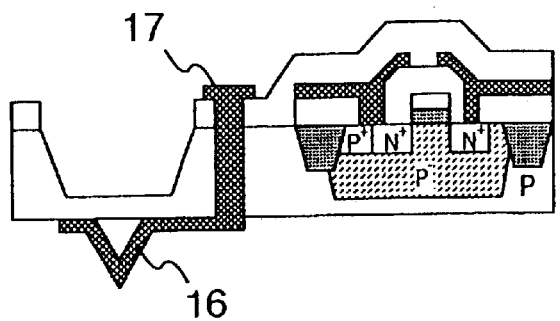

As shown in FIG. 15E, the deposited silicon oxide film is patterned to form an electrode 16, 17. The electrode 17 servers as the external connection terminal (CS1 and the like to be later described). The silicon oxide film OX2 in the area where a wiring lead CN1 or the like to be later described is formed, is selectively removed by photolithography. Thereafter, a lamination layer of Cr and Ni described earlier is deposited by sputtering or the like, and then patterned by photolithography.

Figure 16:
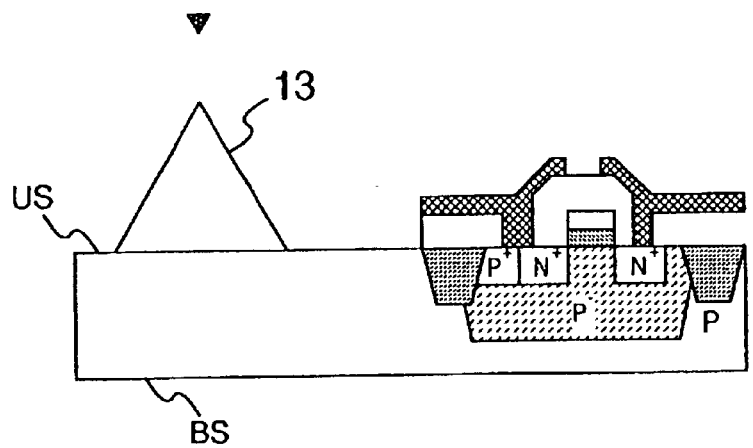
FIG. 16 is a cross sectional view showing another embodiment of the invention.

Another embodiment of the invention will be described with reference to FIGS. 16 to 18.

In the embodiments described above, the probe 13 is formed on the surface opposite to the element forming surface US. In this embodiment, the probe 13 is formed on the same side as the element forming surface US as shown in FIG. 16. In this case, the external connection terminal 17 shown in FIG. 15E is formed on the back surface BS of the substrate SUB. In this embodiment, connection between the probe 13 and MOS element is easy, and the number of through holes 14 can be reduced by using a multiplexer circuit to be described later so that the manufacture yield can be improved. The probe 13 is formed before wells NW and PW are formed.

Figure 17:
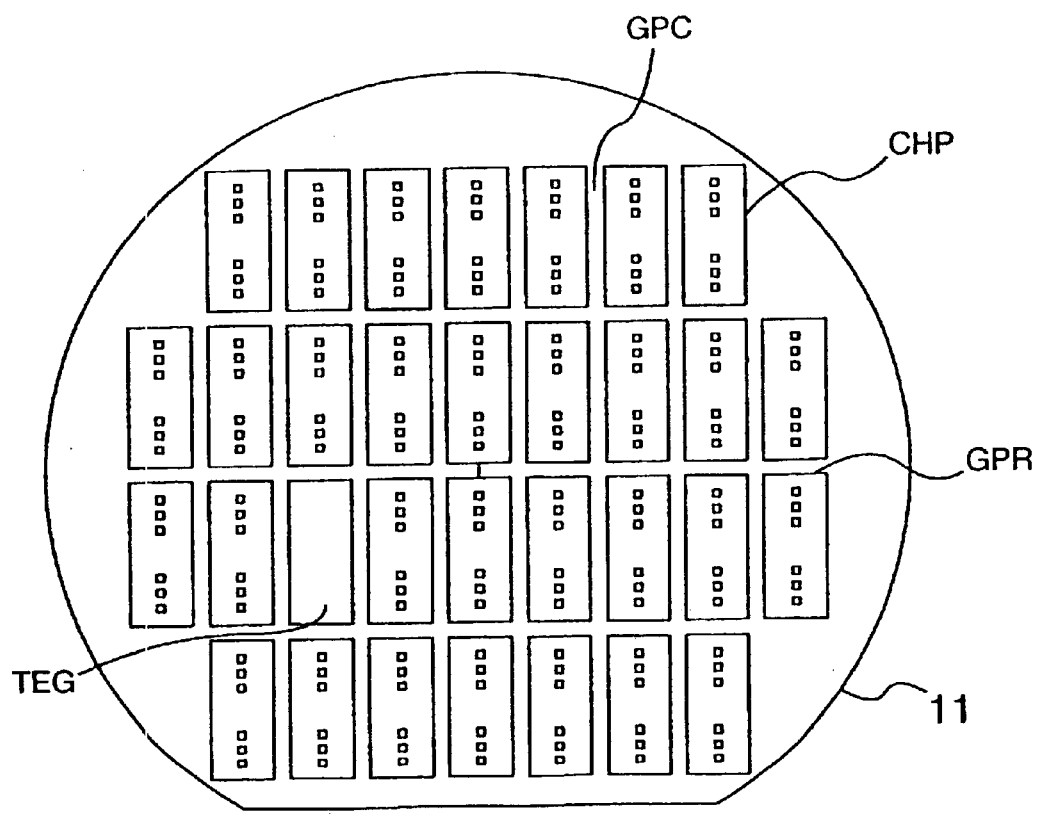
FIG. 17 is a plan view showing another embodiment of the invention.

Referring to FIG. 17, chip areas CHP are defined in a matrix shape in correspondence with a plurality of chips formed on a wafer (to be later scribed off). Between the chip areas CHP, spacer regions GPC belonging to the column and spacer regions GPR belonging to the row are formed, corresponding to chip scribing areas of the test wafer. The GPC and GPR areas are utilized as the wiring regions between the chip areas CHP and GR1 and the like to be later described. In place of the chip areas, two or three areas TEG not formed with the probe 13 and a multiplexer circuit MPX to be described later are provided. This area TEG corresponds to an area where patterns and test elements are formed in accordance with the specifications of the test wafer. A circuit for inspecting the test wafer may be formed in this area TEG. In this case, the inspection circuit formed in this area TEG is connected to the terminal GR1 and multiplexer circuit MPX.

Figure 18:
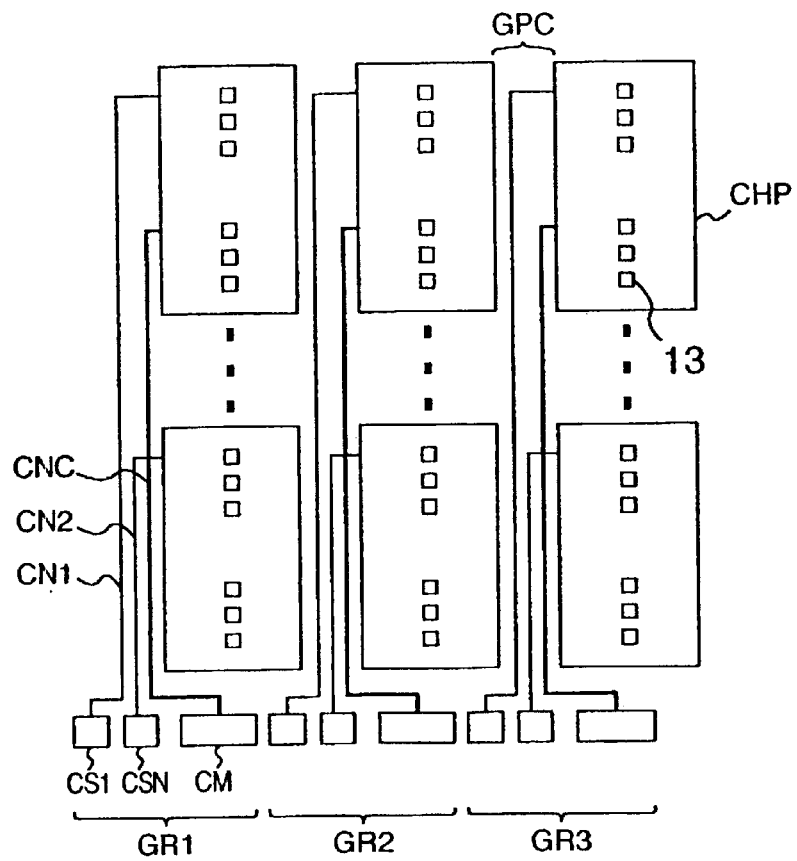
FIG. 18 is a schematic diagram showing another embodiment of the invention.

As shown in FIG. 18, mulitplexer wiring leads are formed for each column in the GPC region. The terminals CS1 to CSN are each used for selecting one of the chip areas CHP in the corresponding column, and each connected to a different chip area CHP. A terminal CM is used in common for each column.

A terminal group GR1 to GR3 having the above-described structure is provided for each column. In other words, signals are transferred in parallel between the tester and test wafer 11 for each column. A bold line CNC represents a plurality of common wiring leads for connection between a plurality of terminals CM and the chip areas CHP.

Figure 19:
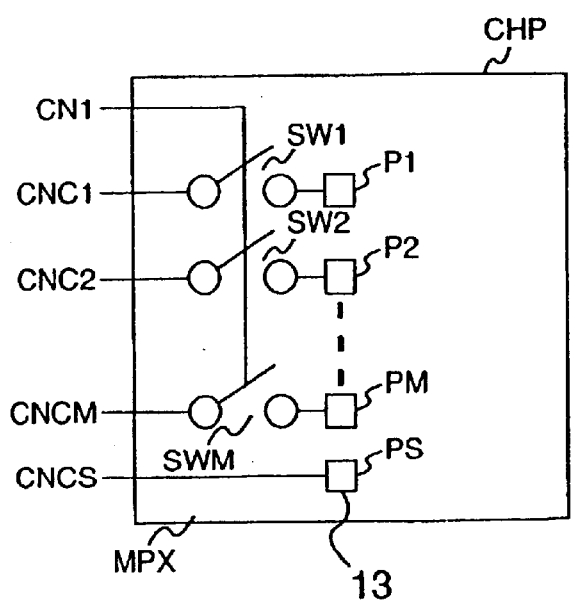
FIG. 19 is a schematic diagram showing another embodiment of the invention.

Referring to FIG. 19, SW1 to SWN represent CMOS switches. Each CMOS switch has source-drain current paths of PMOS and NMOS connected in parallel. Opposite polarity control signals CN1 are applied to the gates of PMOS and NMOS (a CMOS inverter circuit is formed in the multiplexer circuit MPX) so that they turn on and off approximately at the same time.

The multiplexer circuit MPX is effective for reducing the number of connections to the tester. P1, P2, . . . , PM represent probes 13 in each chip area CHP via which input, output, input/output signals are transferred from the tester to test wafer and clock terminals are connected therebetween. The common wiring leads CNC include CNC1, CNC2, . . . , CNCM and CNCS. PS represents a power source line such as positive and negative power lines.

According to the invention, in the electrical characteristic inspection process as one of the semiconductor device manufacture processes, electrode pads of a test wafer in a broad area can be inspected collectively at one time.

What is claimed is:

1. A semiconductor inspection apparatus comprising:
   a plurality of probes formed adjacent one side of a substrate;
   a plurality of electrodes formed adjacent another side of the substrate; and
   through holes and wiring leads for electrically connecting the plurality of probes and the plurality of electrodes;
   wherein the plurality of probes are on deformable support members that allow each probe to move by a displacement distance in response to pressure, and
   wherein the plurality of probes have a spatial orientation corresponding to a spatial orientation of electrode pads of a wafer being inspected.

2. A semiconductor inspection apparatus comprising:
   a plurality of probes formed on a first side of a substrate;
   a plurality of electrodes formed on a second side of the substrate; and
   wiring leads for electrically connecting the plurality of probes and the plurality of electrodes;
   wherein the plurality of probes project from the first side of the substrate, and wherein the apparatus further includes a plurality of support structures for the probes on the substrate, so that each of the probes is on a support structure and so that each of the plurality of support structures is deformable independently from the rest of the substrate, wherein the probes on the support structure are able to move by a displacement distance in response to pressure, and wherein a plurality of through holes are formed from the first side of the substrate to the second side of the substrate, the plurality of probes and the plurality of electrodes are connected via the through holes, and wherein the plurality of probes have a spatial orientation corresponding to a spatial orientation of electrode pads of a wafer being inspected.

3. A semiconductor inspection apparatus, comprising:
   a substrate having a plurality of contacting sections including a plurality of transistors formed thereon and a plurality of probes formed thereon and electrically connected to the transistors;
   wherein a electronic circuit connects with the contacting section;
   and wherein the contacting sections have a pitch that aligns with a pitch of electrode pads of a wafer, and the plurality of probes are situated on deformable support members that allow each probe to move by a displacement distance in response to pressure.

4. A semiconductor inspection apparatus according to claim 3, wherein a multiplexer is formed on the substrate for selectively activating the contacting section.

5. A semiconductor inspection apparatus, comprising;
   a substrate;
   a plurality of contacting sections including a plurality of transistors formed on the substrate; and
   a plurality of probes formed on the substrate and electrically connected to the transistors; and
   wherein the contacting sections have a pitch that aligns with a pitch of electrode pads of a wafer, and the plurality of probes are on deformable support members that allow each probe to move by a displacement distance in response to pressure.

* * * * *